United States Patent [19]
Braceras et al.

[11] Patent Number: 6,038,181
[45] Date of Patent: *Mar. 14, 2000

[54] EFFICIENT SEMICONDUCTOR BURN-IN CIRCUIT AND METHOD OF OPERATION

[75] Inventors: George M. Braceras, Essex Junction; James J. Covino, Montpelier; Richard E. Hee, Colchester; Harold Pilo, Underhill, all of Vt.

[73] Assignee: Internatioal Business Machines Corp., Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/136,112

[22] Filed: Aug. 18, 1998

[51] Int. Cl.$^7$ ..................................................... G11C 7/00
[52] U.S. Cl. ............... 365/201; 365/189.02; 365/189.05; 365/189.07; 365/230.02; 365/233; 365/236
[58] Field of Search ............................... 365/201, 189.05, 365/233, 230.02, 189.02, 236, 189.07

[56] References Cited

U.S. PATENT DOCUMENTS

| | | | |
|---|---|---|---|
| 5,327,074 | 7/1994 | Ehiro | 324/158.1 |
| 5,341,096 | 8/1994 | Yamamura | 324/765 |
| 5,353,254 | 10/1994 | Sakamoto | 365/201 |
| 5,381,087 | 1/1995 | Hirano | 324/158.1 |
| 5,467,356 | 11/1995 | Choi | 327/21.1 |
| 5,493,532 | 2/1996 | McClure | 365/201 |
| 5,511,029 | 4/1996 | Sawada et al. | 365/201 |

*Primary Examiner*—Do Hyun Yoo
*Attorney, Agent, or Firm*—Thornton & Thornton; Francis J. Thornton; Robert A. Walsh

[57] ABSTRACT

The disclosed invention provides a circuit and burn-in test method for semiconductor devices that increases the speed of burn-in tests. The present invention accomplishes this by causing each of the devices under test to be tested multiple times (from 2 to 32+ times) during each power cycle. By such multiple cycling of the unit under test, during the power cycle, the total test time is shortened. It has also been found that the devices tested in accordance with the present invention are more efficiently stressed and have a reliability greater than devices passing the prior art tests. In accordance with the invention, the memory or logic devices under test are provided with a respective clock means that will operate each of the devices under test through multiple (from 2 to 32+ times) write and read operations during each power cycle. Data coherency for each read operation is provided as is the inversion of data if any fail is recorded during a read operation. Accordingly, the present invention provides a burn-in test that more efficiently stresses semiconductor devices such as memory or logic units, by a factor of up to 32. The invention utilizes the internal clock of a semiconductor device by cycling that clock x times during the period of each external clock cycle in the burn-in test and simultaneously synchronizes these internal cycles with the test cycle, thereby providing coherent data for each internal cycle.

10 Claims, 4 Drawing Sheets

EFFICIENT SEMICONDUCTOR BURN-IN CIRCUIT AND METHOD OF OPERATION

FIELD OF THE INVENTION

This invention relates generally to semiconductor device testing, and more particularly to a method for conducting the burn-in test of the internal circuit of a semiconductor memory device which performs the test in a significantly reduced time that by cycling the semiconductor device at a rate substantially faster than the rate of the initiation clock signal and to a method of operating such a test apparatus.

BACKGROUND OF THE INVENTION

Semiconductor devices are liable to defects in circuitry, and these detects increase in proportion to the integration density of the semiconductor device. In order to ensure the reliability of semiconductor devices, it is well knows in the art to screen for detective circuits by performing a burn-in test prior to shipping. This burn-in test drives the internal circuit in an operating condition, but is performed under conditions of stress, i.e., maintaining that device at a high temperature and voltage, in order to ferret out the defects in the circuitry prior to shipment. Specifically, a burn-in test applies a voltage to the device while maintaining that device at a high temperature.

In such burn-in tests the devices are mounted in respective suitable sockets on boards, placed in an oven and heated to a selected temperature which is usually substantially higher than the highest recommended operating temperature of the devices and, while being heated, are repetitively electrically cycled, i.e., powered up or on and then powered down or off. In each such power cycle when the device is turned on, it is tested for failures therein. For example, in a memory device, while powered up, each cell therein would be written and read once and any failures, either read or write would be identified and located.

Typical state of the art burn-in tests, are taught, for example, in U.S. Pat. No. 5,294,776, issued to Tohru Furuyama on Mar. 15, 1994, and U.S. Pat. No. 5,461,328, issued to Devereaux et al. on Oct. 24, 1995. In both these patents the devices, under test, are stimulated and tested only once during the power on portion of each power cycle. Because an adequate test requires that each unit be tested a minimum number of time, a complete burn-in test requires many such power cycles and thus these tests are quite lengthy. Because of their length, such burn-in tests add significantly to the total manufacturing cost of the devices. Thus it is very desirable to reduce the length of these tests for by so doing the manufacturing cost of the devices can be subsequently reduced.

Thus semiconductor devices, such as Random Access Memories (RAMs), and logic units, such as Application Specific Integrated Circuits (ASICs), and Microprocessors, utilized in computers for the storage and retrieval of data computations and etc., are required by JEDEC (Joint Electron, Device and Engineering Council) to be subjected to such burn-in tests. These memories and logic units will herein after be referred to as CMOS devices.

One attempt to reduce this burn-in cost was to increase the size of the burn-in board and thus increase the number of devices being tested during each power on portion of each power cycle. It was found, however that such an increase in the size of the burn-in boards required the use of even longer burn-in clock cycles, which further increased the duration of the burn-in to maintain the same number of stress cycles. These long, burn-in clock cycles adequate for stressing static CMOS logic, present an efficiency problem for high performance self-resetting CMOS circuitry.

For example, in the case of static CMOS SRAM circuits, the power cycle of the array's periphery devices follows the system clock which, for example, is 6 nanoseconds. By periphery devices is meant those devices that form the array support circuits, such as the sense amplifiers, and etc. This means, in such a static CMOS circuit, the periphery devices will be active, i.e., powered on for 3 nanoseconds, during the first half of the system or external clock cycle time and inactive, i.e., in the reset or power off mode, for 3 nanoseconds, i.e., the second half of the system clock cycle time. Thus, in a burn-in situation the SRAM's periphery devices are evenly stressed. This remains constant regardless of the duration of the system clock cycle time. For example, in a burn-in test, if the system clock has a cycle time of 200 nanoseconds (as typically required for proper burn-in operation) then all the periphery devices in the module continue to be evenly stressed, for in this case the periphery devices of the module will remain active for the first half of the system clock cycle (100 nanoseconds) and will be inactive, in the reset mode, for the second half of the system clock cycle (100 nanoseconds).

However, for a self-resetting CMOS circuit, using present day technologies, the length of time that the periphery devices are active is determined not by the system clock cycle time but by a delay built in the self-resetting CMOS circuit. Thus the time the self-resetting CMOS circuit array devices are active is independent of the duty cycle of the system clock. For example, if we assume the delay time of the self-resetting CMOS array is two nanoseconds and again assume that the cycle of the system clock is six nanoseconds, then the self-resetting CMOS circuit array devices will be active or powered on for only two nanoseconds during the three nanosecond first half of the system clock cycle time and inactive, i.e., in the reset or power off mode, for four nanoseconds, i.e., one nanosecond of the first half of the system clock cycle time and the entire 3 nanosecond second half of the system clock cycle time. However with a lengthened system clock cycle time of 200 nanoseconds, as typically required for a proper burn-in operation, the periphery devices of these self-resetting CMOS circuits will still only be on or active for 2 nanoseconds, and will be in the reset or off mode, and thus inactive, for 198 nanoseconds. This remains true even though such periphery devices are capable of running up to one-hundred times faster. Such an imbalance between the active and inactive times of the periphery devices of the self-resetting CMOS circuit does not properly stress the periphery devices of the self resetting CMOS circuit and thus it is necessary to increase the total burn-in time. However to achieve parity of burn-in stressing between self-resetting CMOS circuits and static CMOS circuits is cost prohibitive because of the long times that would be required.

The inefficiency inherent in burn-in stressing of devices, such as self-resetting circuits, with such a short active time and a long reset time has remained a severely limiting factor in achieving adequate burn-in testing of self-resetting CMOS circuits and remains a significant cost of production of such self-resetting CMOS circuits.

One method that has been proposed to overcome this burn-in efficiency problem is to disable the circuit's self-resetting path during burn-in and provide a separate clock input and additional logic to allow the self-resetting circuit to behave as a static CMOS circuit. However, this requires additional logic circuits in each circuit to be tested thereby increasing circuit complexity and circuit cost while requiring a special clock network.

It is thus desirable that a new method be developed whereby such test times can be shortened by a factor of four or more thus reducing the cost of such tests, while maintaining maximum efficiently and a low duty cycle.

The present invention overcomes the above described problems encountered in the burn-in testing of a self-resetting CMOS circuit and achieves increased efficiency in such burn-in testing, without requiring additional logic at each circuit stage, by causing such self-resetting CMOS circuit to self reset multiple times during the active portion of the burn-in clock cycle, i.e., while the system burn-in chamber clock is high, thereby permitting the input data to cycle through the CMOS circuit multiple times thereby increasing the number of times the circuits are stressed in the active region during the burn-in clock cycle.

SUMMARY OF THE INVENTION

Burn-in cost is a significant portion of the total manufacturing cost of semiconductor devices, and long burn-in test times are a significant factor in burn-in cost. Increases in burn-in test speed previously have been limited. While applying a higher voltage increases speed of operation, the correspondingly increased temperature generated by that higher voltage slows the operation and lowers efficiency. Typical RAM burn-in cycle times are currently greater than 200 nanoseconds (ns), even though RAMs are capable of running up to one-hundred times faster, Therefore, the inefficiency inherent in the relatively slow speed of current burn-in tests is a severely limiting factor in the speed, production of RAM chips.

The present invention cuts burn-in cost by reducing burn-in time. It also allows for more efficient stressing, which will improve the reliability of RAM products. The invention achieves these results by using the internal RAM clock to cycle the device multiple times during the slower burn-in cycle, and simultaneously synchronizes that internal clock with an external clock set to the burn-in cycle time. This synchronization provides coherent data for every internal cycle. As a result, the invention accelerates burn-in test time, which significantly increases test efficiency and reduces final product cost.

Broadly, the invention is a burn-in test circuit and method for burn-in testing of semiconductor devices, such as memory or logic units, both individual devices or modules, which provides a means for increasing the number of test stimulations in each power cycle without increasing the number or length of the power cycles and thus avoiding the difficulties encountered by prior art proposals.

The present invention therefore cuts burn-in cost by reducing burn-in time. It also allows for more efficient stressing, which will improve the reliability of RAM products.

The present invention accomplishes this by causing each of the devices under test to be tested multiple times (from 2 to 32+ times) during each power cycle. By such multiple cycling of the unit under test, during the power cycle, it has been found that the total test time ma be shortened. It has also been found that the devices tested, in accordance with the present invention are more efficiently stressed. It was further found that devices passing the test, of the present invention, have a reliability greater than devices passing the prior art tests.

In accordance with the invention, the memory or logic devices under test are provided with a respective clock means that will operate each of the devices under test through multiple (from 2 to 32+ times) write and read operations during each power cycle. Means for providing data coherency for each read operation and means for inverting the data if any fail is recorded during a read operation are also provided.

Accordingly, the present invention provides a burn-in test that more efficiently stresses semiconductor devices such as memory or logic units.

Further the present invention can reduce burn-in cost by reducing the time necessary to run a burn-in test of such semiconductor devices.

Still further the present invention utilizes the internal clock of a semiconductor device by cycling the output of the internal clock a plurality of times during each power on cycle, and simultaneously synchronize these internal clock cycles with the power on cycle to provide coherent data for each internal cycle.

These and other objectives and features of the present invention will become apparent from the following description taken in conjunction with the drawings.

DESCRIPTION OF THE PREFERRED EMBODIMENT

Figure 1:
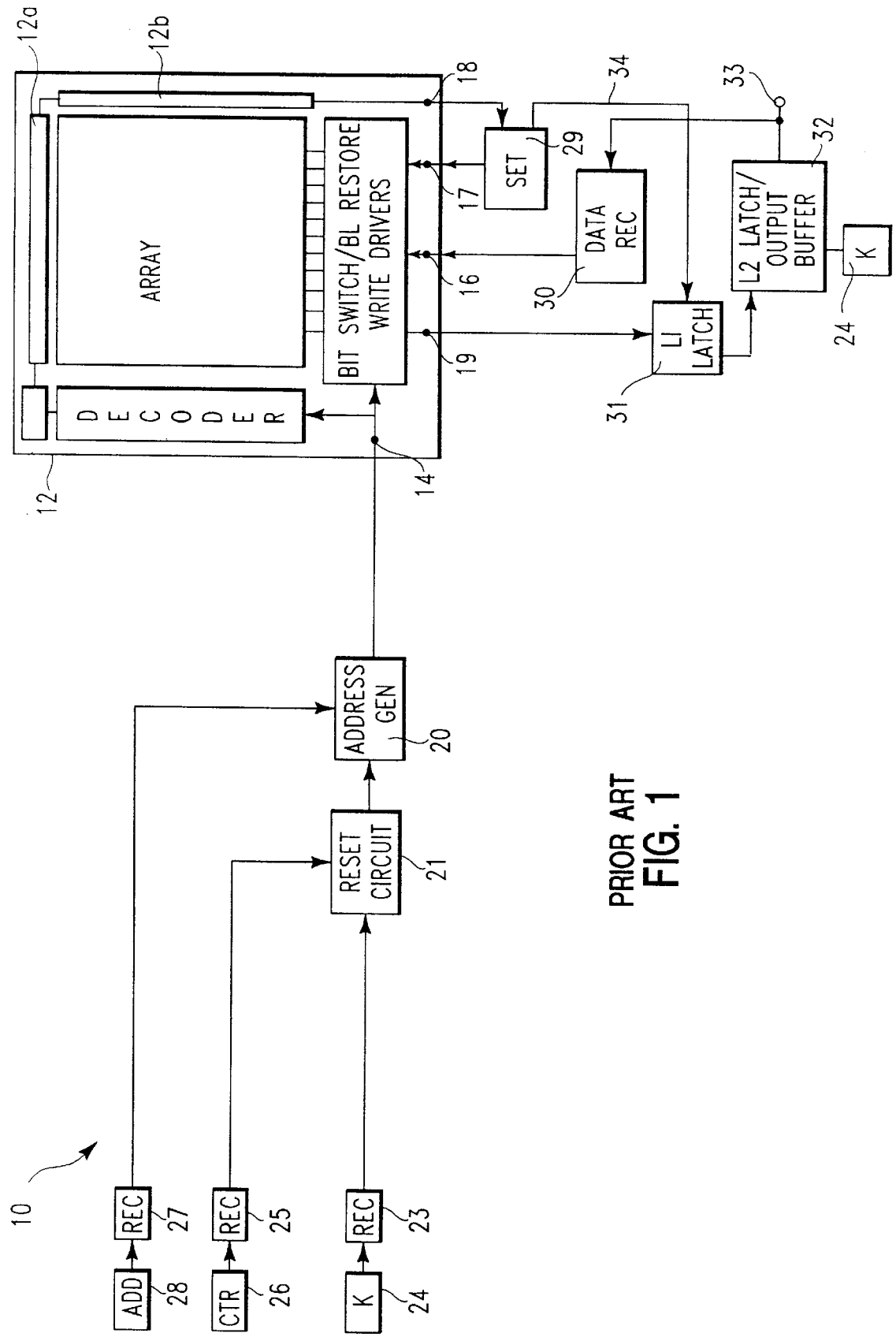
FIG. 1 is a block diagram of a prior art SRAM circuit as it would appear while being subjected to burn-in testing.

FIG. 1 shows, in block diagram form, a prior art Random Access Memory (RAM) circuit coupled to a testing apparatus tor burn-in testing of the circuit.

In FIG. 1 the RAM circuit 10 to be subjected to burn-in will, for purposes of example only, be assumed to be a standard, prior art, Static Random Access Memory (SRAM) array containing a memory cell array 12 having the usual, word and bit decoders, driver circuits and sense amplifiers, etc. therewith.

The array 12 further has a plurality of inputs including, an internal address line input 14, a data-in input 16, and a set input 17 and also has a pair outputs which include a data line output 19 and a dummy bit line output 18.

The internal address line input 14 is coupled, through an address generator 20, to an internal self reset circuit 21 and thence through a clock receiver 23 to an external clock 24. Typically, under burn-in test conditions, the external clock is relatively slow and its pulses will cyclically power up and power down, i.e., turn on and turn off, the SRAM 10 and the output latch once every 200 nanoseconds.

The internal address line input 14 is further coupled, through the address generator 20, the self reset circuit 21 and a first control receiver 25 to controller inputs 26. The internal address lines input 14 is also coupled, through the address venerator 20, to an address input 28 through a second receiver 27. The array input 16 is coupled through a data receiver 30 to the array input/output data node 33.

The set input 17 of the array 12 is coupled through a sense amplifier/set circuit 29 to the dummy bitline output 18 of the array 12. The sense amplifier/set circuit 29 also has an output 34 (SETG) coupled to a first input of a first data latch 31. The output 18 of the array 12 is coupled to a second input of this first data latch 31.

Figure 2:
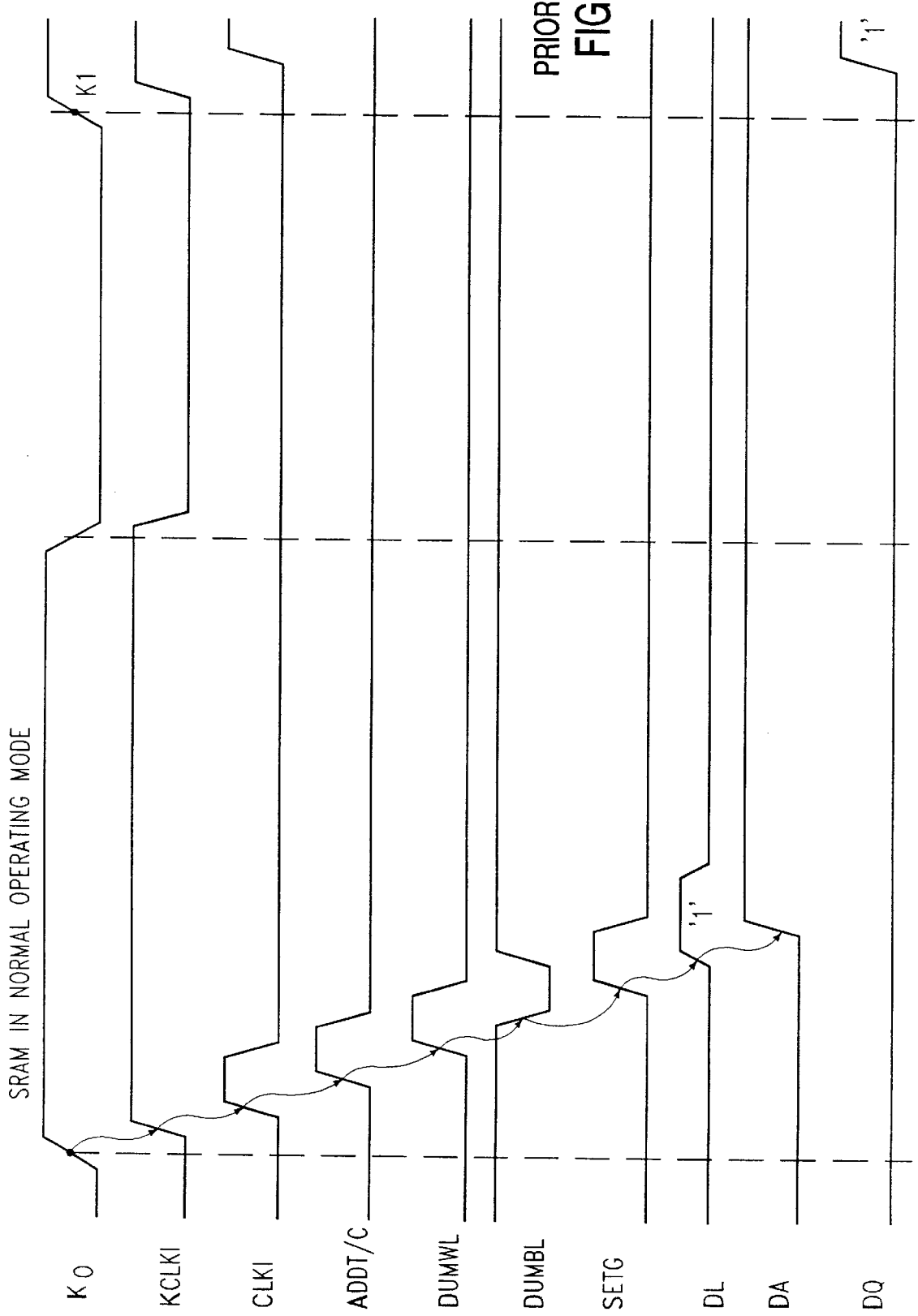
FIG. 2 schematically illustrates various pulses in the prior art SRAM of FIG. 1 during one external clock cycle while being subjected to burn-in testing.
Figure 3:
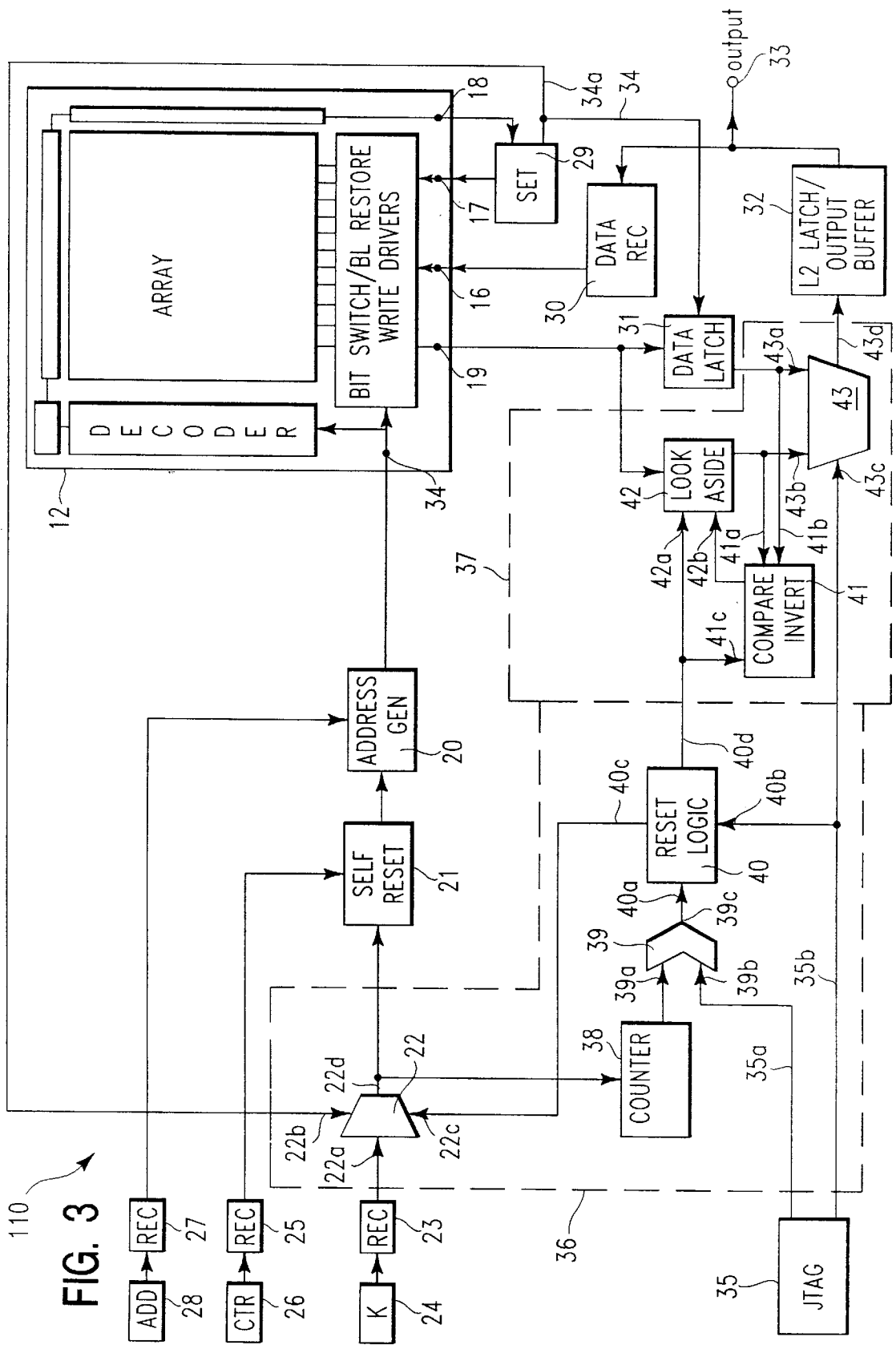
FIG. 3 is a block diagram of the SRAM circuit of the present invention coupled to a JTAG test apparatus for burn-in testing.

With reference now to FIGS. 1 and 2, a burn-in test of a prior art SRAM will be discussed below. Broadly, the chip 10, is subjected to a burn-in test, by placing the chip in a suitable heating apparatus or oven, heating the chip to a selected temperature and operating the chip through a selected series of operations. Such burn-in testing is well known and widely practiced in the art. Once the chip reached the selected burn-in temperature, then at the start of the next external clock signal $K_0$ from the clock 24, there is venerated at the output of the self reset circuit 21 a self-resetting signal pulse CLKI, as shown in FIG. 3. This pulse CLKI strobes the address inputs of the address true/compliment generator circuit 20 to create self-resetting address true/compliment pairs (ADDT/C) (not shown in FIG. 2) which are then provided to the SRAM array 12, at via the internal address line input 14 to access the array data.

At this time the self reset circuit, being driven by an internal clock (not shown) resets itself in typically within 3 to 5 nanoseconds and, once reset, will not be reactuated until a new clock signal $K_1$ is received. In some SRAM embodiments special timing chains are used to synchronize the SRAM's sense amplifiers with the arrival of data from the array. In this instance, the array 12 generates signals, DUMWL (dummy wordline) and DUMBL (dummy bitline), internally that are used to generate, in the set circuit 29, signals SET and SETG. The signal SET is sent to the set input 17 to activate the sense amplifiers, in the array and thereby allow data to propagate, through output 19, onto the data lines (DL) and subsequently the output latches 31 and 32 and thence to the chip output (DQ) at node 33.

In detail, this test sequence of the prior art SRAM 10 during burn-in is as follows.

The external clock 24 is running continuously and is sending 200 nanosecond clock cycles K to the clock receiver circuit 23. Each clock cycle K is for the first half of its cycle (100 nanoseconds) positive or high and for the second half of its cycle (100 nanoseconds) negative or low. When the tester indicates that a test is to begin, the rising, leading edge of the positive, first half of the cycle of the next clock signal $K_0$, from clock 24 initiates, in the clock receiver circuit 23, a positive pulse KCLKI which is sent to the self reset circuit 21. When the rising, leading edge of the positive pulse KCLKI is received by the self reset circuit 21, the self reset circuit 21 is conditioned to pass a single, 3 nanosecond positive pulse CLKI, initiated by the controller 26, to the address generator 20.

As is well known to the art, when the SRAM 10 is turned on, a fast internal clock (not shown) having a cycle time, typically of about 3 to 5 nanoseconds, is activated therein and this internal clock signal is fed back to the self reset circuit 21 so that the self reset circuit 21 and the full SRAM is reset to await a news external clock signal. This pulse CLKI sets the address generator 20 in condition to pass, for 3 nanoseconds, a selected address signal ADDT/C, from the address input 28, to the array 12, via the internal address line input 14 to activate selected devices in the array 12.

With the selected address, the dummy wordline 12a, in the array 12, sends a positive pulse DUMWL to the dummy bitline 12b which now sends a negative pulse DUMBL through an output 18 to the sense amplifier/set circuit 29. The pulse DUMBL causes the circuit 29 to send a signal SET (not shown in FIG. 2) to the array 12, via input 17.

Signal SET permits the sense amplifiers in the array 12 to send data, via the data line output 19 to the latch 31. Simultaneously, the set circuit 29 also send a positive signal SETG (not shown in FIG. 2) to the first data latch 31 permitting the data latch 31 to pass the received data (pulse DL) to the second latching circuit 32 which goes high as shown by the positive pulse DA. Because the SRAM 10 is self resetting and each cycle therein is initiated by leading edge of the external clock cycle K, no additional pulse sequences occur until the entire 200 nanosecond external clock cycle $K_0$ ends and a new clock cycle, $K_1$ begins and the above described test sequence is repeated. This new clock cycle $K_1$ is also simultaneously sent to the latch 32 to unlatch it. When the latch 32 unlatches, the data is sent off chip via the input/output node 33. In this instance, the positive pulse DQ indicates that the tested address as good.

Conversely, if the data sent off chip does not match the expected data then it means that a failure has occurred in the SRAM.

As discussed above, the tested devices, in the array, are active for only about 3 nanoseconds, i.e., during the entire 200 nanosecond cycle of the system clock and inactive, i.e., in the reset mode, for 197 nanoseconds of the system clock cycle time. Thus, the prior art array devices now available cannot and are not evenly stressed during a burn-in test.

The present invention is designed to relieve such uneven stressing of the self resetting devices during burn-in and accomplices this adding, to the SRAM circuit as will be discussed below in conjunction with FIG. 3, special reset and data compare circuits with selective feedback paths.

FIG. 3 sets forth, in a block diagram, an improved Random Access Memory (RAM) designed in accordance with the present invention. For purpose of example only, this array will again be assumed to be a Static Random Access Memory (SRAM). It should be further noted, however, the present invention can be used with any type of Random Access Memory, static or dynamic, a logic unit or a Microprocessor, in either module or chip form.

The improved SRAM of the present invention, as shown in this FIG. 3, has a plurality of circuit elements that are identical to the circuit elements of FIG. 1 but is different from that shown in FIG. 1 by including an additional restore logic circuit and a compare latching circuit. Those elements, in FIG. 3 that are identical to the elements of FIG. 1 are identified with the same numerals that were used in FIG. 1. Thus, this improved SRAM 110 contains a memory cell array 12 having the usual, word and bit decoders, driver circuits and sense amplifiers, etc. therewith.

The internal address line input 14 is again coupled, through the address generator 20, to the self reset circuit 21 and thence through a three input, single output, 2:1 multiplexor circuit 22, which forms a portion of the newly added restore logic circuit 36, to the clock receiver 23 and the external clock 24. Again, under test conditions, the external clock is relatively slow and its pulses will cyclically power up and power down, i.e., turn on and turn off, the SRAM 110 and the output latch, once every 200 nanoseconds.

The internal address line input 14 is also again coupled, through the address generator 20, the self reset circuit 21 and the first control receiver 25 to the control inputs 26. The internal address line input 14 is also coupled, through the address generator 20, to the address input 28 through the second receiver 27. The array input 16 is again coupled through the data receiver 30 to the array input/output data node 33.

The set input 17 of the array 12 is again coupled through the sense amplifier/set circuit 29 to the dummy bitline output 18 of the array 12. However, the sense amplifier/set circuit 29 now has its output 34 (SETG) coupled not only to a first input of the first data latch 31 but also to input 22b of the multiplexor circuit 22 in the restore logic circuit 36 via line 34a.

The restore logic circuit 36, as shown in FIG. 3, comprises, in addition to the multiplexor circuit 22, discussed above, a single input, single output counter 38, a two input, single output comparator 39 and a two input, two output reset logic circuit 40. The counter 38 is set to a preselected number equal to the times the device is to be recycled during the first half of the external clock pulse. During the typical 200 nanosecond external clock pulse this number can typically range between 2 and 32 but can be in excess of 32. The counter 38 is coupled between the output 22d of the multiplexor 22 and a first input 39a of the second comparator circuit 39. The stop count line 35a, leading from the JTAG test logic circuit 35, is connected to the other input 39b of the comparator 39. The output 39c of the comparator 39 is coupled to a first input 40a of the reset logic circuit 40. The burn-in multi-mode line 35b leading from the JTAG test logic circuit 35 is connected to the second input 40b of the reset logic circuit 40 and to the input 43c of the multiplexor 43. The output 40c of the reset logic circuit is coupled to the input 22c of the multiplexor 22.

The output 19, in addition to being coupled to data latch 31, is also coupled to the compare latching circuit 37. This compare latching circuit 37 comprises a three input, single output compare/inverting circuit 41, a three input single output look aside latch circuit 42 and a three input, single output, multiplexor 43. Specifically the data output 19, of the array 12, is now coupled to the input of the first data latch 31 and to the look aside latch 42. The outputs of both latches 31 and 42 are coupled to the multiplexor 43 and to the compare/invert circuit 41 which has its output coupled back to the look aside latch 42.

The latching circuit 37 comprises a two input, single output data latch 31 and a three input, single output, look aside latch 42. Each of these latches have their outputs coupled to the node 33 via a three input, single output, multiplexor 43, and to a single input, single output, buffer/latch 32. The first and second inputs, 43a and 43b, of the multiplexor 43, as well as being coupled to the respective outputs of the data latch 31 and the look aside latch 42 are further respectively coupled to inputs, 41b and 41a, of the comparator/inverter circuit 41.

Broadly speaking, the SRAM 110, of the present invention is tested as will be described below and in conjunction with FIGS. 3 and 4.

For purposes of this description, it will be assumed that the chip is being subjected to Burn-In and further that the JTAG test logic circuit 35 has been loaded with a counter value (VSC) which is sent, via line 35a, to signal a stop to the cycle multiplying signal as will be further discussed below. The JTAG test logic circuit 35 can also be loaded with special instructions designed for other purposes.

While in the burn-in mode, the SRAM receives, from the external clock 24, a 200 nanosecond clock pulse $K_0$ that passes through the multiplexor 22 to generate at the output of the self reset circuit 21 a signal pulse CLKI that is used to strobe, at input 26, the address inputs (ADDI) (not shown in FIG. 4) being emitted by the address input 26 through the true/compliment address generator circuit 20 to create self-resetting address true/compliment pairs (ADDT/C) (not shown in FIG. 4) which are then provided to the SRAM array 12, at internal address line input 14, to access the selected memory cells in the array 12. If necessary, special timing chains can be used to synchronize the SRAM's sense amplifiers with the arrival of data from the array. In this instance, the dummy wordline (DUMWL) and dummy bitline (DUMBL) signals appear at the array output 19 and are sent to the set circuit 29 to generate in the set circuit the signals SET (not shown in FIG. 4) and SETG (not shown in FIG. 4). The signal SET is fed to array input 17 and used to activate the array sense amplifiers and thereby allow data to propagate onto the data lines (DL), at output 19, and subsequently through the two stages of output latching to the chip input/output data node 33.

Simultaneously the signal SETG is fed back, via line 34a, to the multiplexor 22 which is positioned between the clock input. The SETG signal is here multiplexed, with the primary clock signal $K_0$, to substitute for the clock input from external clock 24 during the burn-in mode.

The key issue, for the present invention, is the routine of the signal SETG that indicates that data has been read out of the array and that another SRAM cycle can start. It is this signal SETG, which is used, in conjunction with the restore logic circuit 36, to use the normal self setting action of the SRAM to initiate multiple internal test cycles in a single external cycle. The signal SETG does this by controlling the multiplexor 22 such that the SRAM will recycle the predetermined number of times set in the restore logic circuit, counter 38.

Figure 4:
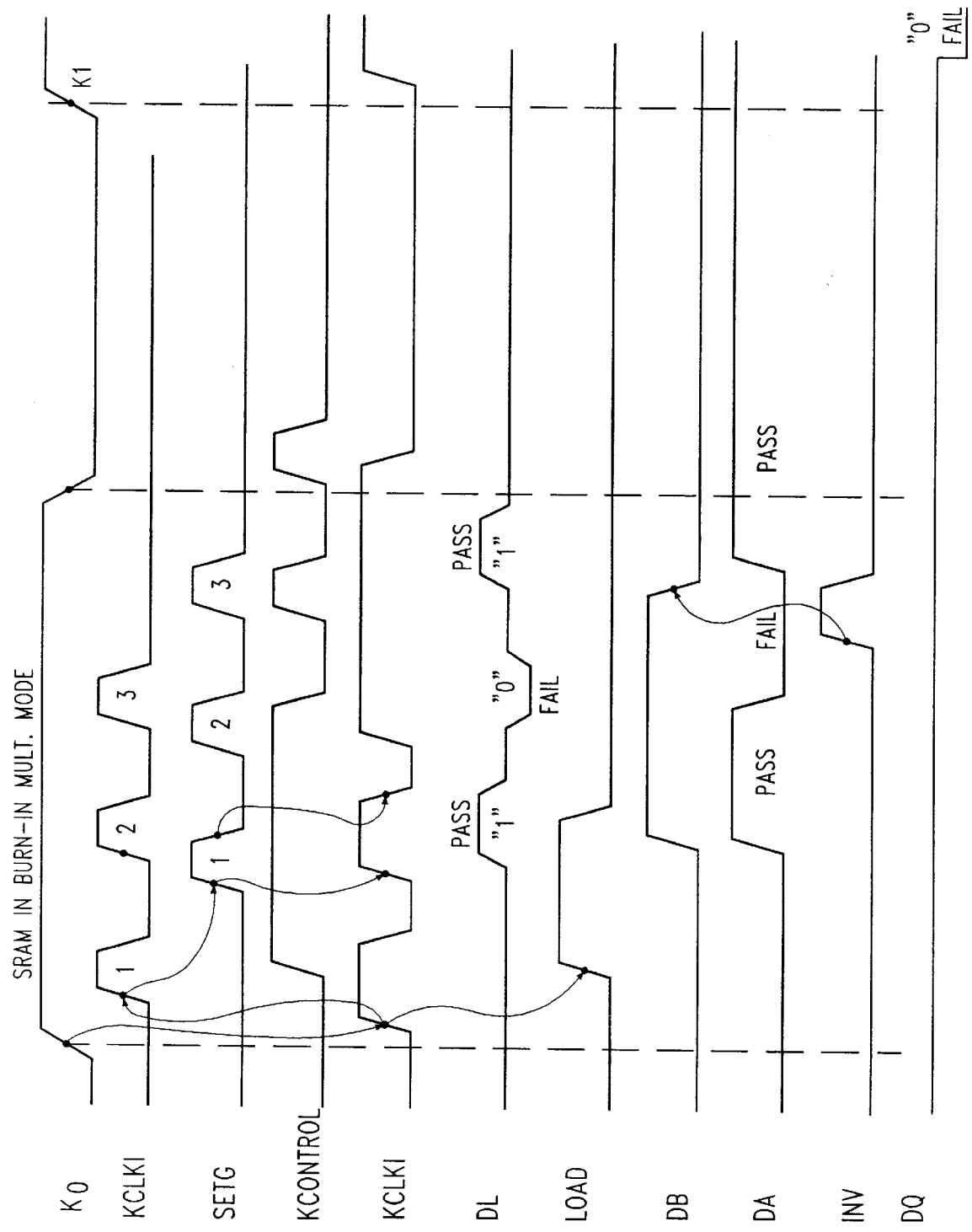
FIG. 4 schematically illustrates various pulses in the SRAM of FIG. 3 during one external clock cycle while being subjected to burn-in testing.

FIG. 4, illustrates, in greater, detail the operation of the invention, shown in FIG. 3. The JTAG test logic circuit 35 is loaded and the burn-in mode becomes active and remains so for the selected burn-in duration. The signal KCONTROL from the output 40c of the reset logic circuit 40 is initially low, allowing the primary system clock 24, signal $K_0$, as shown in FIG. 4, in conjunction, with the restore logic circuit 36, to be passed through the 2-1 multiplexor 22 and supply a positive signal KCLKI to the self reset circuit 21 and to the counter 38 in the restore logic circuit restore logic circuit 36. This positive signal KCLKI starts the counter 38 and simultaneously causes the self reset circuit 21 to initiate the first of a series of KCLKI pulses which are sent to the address generator 20. At this same time the signals KCONTROL and LOAD are activated, by the reset logic circuit 40, and respectfully sent to the multiplexor 22, to the look aside latch 42 and the compare invert circuit 41. The signal KCONTROL now sets the multiplexor 22 such that its output signal KCLKI will be now be controlled by the signal SETG, fed back via line 34a from the set circuit 29, instead of being controlled by the primary system clock 24.

Since the signal SETG is low when the signal KCONTROL goes active or high, the signal KCLKI goes low, making the SRAM's clock input appear to have a faster cycle time. Meanwhile, the first CLKI pulse strobes the address generator 20 permitting the addresses from the address input 26 to be sent to the SRAM array internal address line input 14. These addresses generate, in the array 12, dummy wordline (DUMWL) and dummy bitline (DUMBL) signals (not shown) and ultimately, via the set circuit 29, the signal SETG. By the time the signal SETG goes high, the SRAM array 12 has already generated data shown here as the high signal DL. Once data has been sent out of the array the array is ready to accept new address inputs at internal address line input 14. Thus, the SRAM can now be cycled again.

The restore logic circuit, does this by sending a clock lockout signal KCONTROL to input 22c of the multiplexor 22 enabling the 2:1 clock multiplexor 22 to lock out the external clock signal K and thereby pass control of the self reset circuit to the SETG signal. The restore logic circuit does this by having the counter 38 send a signal through the comparator 39 to the reset logic circuit 40 which in turns sends the clock lockout signal to the multiplexor 22. With the multiplexor 22 blocking the external clock signal, the internal clock signal SETG fed back to the array, via the multiplexor 22 to the self reset circuit 21 which emits a new high pulse CLKI to the address generator 20 thereby launching a second address signal ADDT/C to initiate another full addressing cycle in the array. The SETG signals appearing at the output 22d of multiplexor 22 are also sent to the counter 38. The presence of this internally generated, clock signal SETG, which is typically running at 3 nanoseconds per cycle, thus causes the array 10 to cycle at 3 nanoseconds per cycle. This cycling of the array 10 continues until the number of signals at the output 22d of the multiplexor circuit 22 equals the number preset in the counter 38. When this occurs, the addressing cycles cease until the a ne external clock signal K sends a new KCLKI signal to the self reset circuit 21.

In this way the array 10 will continue to cycle on itself, i.e., basically oscillating, until the number of pulses matches the number preset in the counter 38. When the number of KCLKI pulses so match the number stored in the counter 38, the counter 38 sends a signal (not shown) to the comparator 39. When the comparator 39 receives this signal which matches the preset value (VSC), the reset logic circuit 40 is deactivated and the signal to input 22c of multiplexor 22 is set low to return control of the multiplexor 22 back to the external system clock 24.

It should be noted, the array's address and control inputs only change with the external system clock. Thus while the multiplexor 22 is under the control of the signal SETG, each of the self-generated cycles will repetitively test the same address.

In the example shown in FIG. 4, during the first SRAM cycle a "1" is read out of the array 12, at output 18, onto the data lines (DL) and to the latches 31a and 42. Because, as noted above, the LOAD signal to the look aside latch 42 and the compare invert circuit 41 is active or high, this data, on the data lines, will be latched into both the data latch 31 and the look aside latch 42 causing their outputs, coupled to inputs 43a and 43b respectively of the multiplexor 43, to go high. After the first bit of data has been stored into the look aside latch the signal LOAD is reset and isolates the data stored in the look aside latch 42 so that it can be compared to data resulting to subsequent clocking cycles CLKI.

The multiplexor 43 is thus set such that data, in the latches 31 and 42 will not be passed to the node 33 and off the chip 10 until the next rising edge of the external system clock (K).

If all the data resulting from each CLKI signal are all identical, i.e., the data is either all positive or all negative, then, at the next rising of the external clock K signal, when the data is clocked off chip at node 33 it will indicate the tested region is good.

However, if, during the second cycle, i.e., after the signals KCLKI and SETG both go high, as shown in FIG. 4, the data read from the same address is a "0", this indicates a burn-in fail, the data output line DL, from array output 19 goes low or inactive. Because a "1" was previously stored in the look aside latch 42, a mismatch occurs when this new data is compared to the data previously stored in the look aside latch 42 and an inverted signal INV from the compare invert circuit 41 goes high to invert the data stored in the look aside latch. The data inversion causes the fail to be detected when the look aside data is driven off the chip during the next external clock cycle K. The INV signal can only go high once for a given system or external clock cycle K.

As shown in FIG. 4, even if, in the third cycle the array reads the data as a "1" the look aside latch 42 being already be set by the INV signal prevents the third cycles data from being read and only a fail or low signal will be passed to the node 33 at the start of the next external clock cycle K. Thus a fail will be detected when DQ is driven low at the start of the next external clock cycle $K_1$.

By using the present invention as described above and shown in FIGS. 3 and 4, it can be seen that multiple addressing cycles can be completed during the first half of the external clock cycle K where normally there would be only one. The total number of cycles possible, in this first half of the external clock cycle K, is determined by the length of the addressing cycles and the length of the clock cycle K. For example, an SRAM with a 3 nanosecond minimum addressing cycle can easily clock approximately thirty-three (33) times within the typical 200 ns (100 ns positive phase) burn-in cycle.

Power restrictions of the burn-in equipment might limit the number of cycles to some value less than the maximum. By increasing the number of cycles, burn-in effectiveness has been increased.

Thus there has been described a clocked test apparatus that will more rapidly test semiconductor devices by utilizing, an internal clock in the device to cycle the device multiple times during each test clock cycle. Thus the present invention causes the device, under test, to be cycled internally at a rate that is a multiple of the test clock cycle time. This results in a significant reduction in burn-in time and test cost. The invention also provides more efficient stressing of the device under test thus improving the reliability of the tested devices.

This completes the description of the preferred embodiment of the invention. Since changes may be made in the above construction and method without departing from the scope of the invention described herein, it is intended that all the matter contained in the above description or shown in the accompanying drawings will be interpreted in an illustrative sense and not in a limiting sense. Thus other alternatives and modifications will now become apparent to those skilled in the art without departing from the spirit and scope of the invention as set forth in the following claims.

What is claimed is:

1. A static random access memory device comprising:

a random access memory array having a plurality of memory storage units therein and an address input line, a set input line, a plurality of output data lines and a dummy bit line output;

a self reset circuit coupled to the address input line of said array through an address generator;

an external clock having an output and an input coupled to said self reset circuit, said external clock emitting an external clock pulse, having a first half and a second half;

a set circuit having an input coupled to the dummy bit line output and having first and second outputs, the first output being coupled to the set input line;

address generation means for sending a test cycle to said random access memory array;

a data latch having first and second inputs and an output, the first input of said data latch being coupled to said memory array output data lines and the second input of said data latch being coupled to the second output of said set circuit;

a look aside latch having first, second and third inputs and an output, the first input of said look aside latch being coupled to the first input of said data latch;

a device output coupled to the output of the data latch; and feedback means coupling the second output of said set circuit to said self reset circuit to cause said self reset circuit to reset a predetermined number of times during said external clock pulse emitted by said external clock.

2. A static random access memory module comprising:

a random access memory array having a plurality of memory storage units therein and an address input line, a set input line, a plurality of output data lines and a dummy bit line output;

a self reset circuit coupled to the address input line of said array through an address generator;

an external clock having an output coupled to said self reset circuit, said external clock emitting an external clock pulse, having a first half and a second half;

a set circuit coupled to the dummy bit line output and having first and second outputs, the first output being coupled to the set input line;

address generation means for sending a test cycle to said random access memory array;

a data latch having first and second inputs and an output, the first input of said data latch being coupled to said memory array output data lines and the second input of said data latch being coupled to the second output of said set circuit;

a module output coupled to the output of the data latch; and feedback means comprising a restore logic circuit coupled to the second output of said set circuit and between said self reset circuit and said external clock output; and a compare latching circuit coupled between the restore logic circuit and the output of said data latch and said module output.

3. The module of claim 2 wherein said restore logic circuit comprises a first single output multiplexor circuit having a first, second and third input, coupled between the external clock and said self reset circuit;

a single input, single output counter coupled between the first multiplexor circuit and a single output comparator having a first and a second input, and a reset logic circuit having a first and a second output and a first and a second input with said first input coupled to the output of said comparator and the first output being coupled to the first input of said first multiplexor circuit.

4. The module of claim 3 wherein said output counter is set to a preselected number which is equal to the times the test cycle is to be recycled through the memory array during the first half of said pulse emitted by said external clock.

5. The module of claim 4 wherein:

said preselected number can range between 2 and 32.

6. The module of claim 3 wherein:

said counter is coupled between the output of the first multiplexor circuit and the first input of the comparator, and there is further provided a stop count line from a tester to the second input of the comparator.

7. The module of claim 4 wherein:

there is further provided means for coupling a burn-in multi-mode line from a tester to said second input of the reset logic circuit, and means for coupling the first output of the reset logic circuit to said first multiplexor circuit and for coupling the second output of the reset logic circuit to the compare latching circuit.

8. The module of claim 3 wherein:

the compare latching circuit comprises a three input, single output compare/inverting circuit, a single output look aside latch circuit having a first, a second and a third input and a second single output, multiplexor circuit having a first, a second and a third input.

9. The module of claim 8 wherein:

the output data lines are coupled to the first input of the the look aside latch circuit;

the outputs of both the data latch and the look aside latch circuit are coupled to the second single output, three input multiplexor circuit and to selected, respective inputs of the compare/inverting circuit;

the output of the compare/inverting circuit is coupled to the second input of the look aside latch circuit; and the output of the second multiplexor circuit is coupled to a single input, single output buffer/latch.

10. A method of testing, for a selected period of time set by an external clock, a random access memory module having a plurality of circuits therein, said circuits including, a random access memory array having a plurality of memory storage units therein and an address input line, a set input line, a plurality of output data lines and a dummy bit line output; a self reset circuit coupled to the address input line of said array through an address generator; the external clock having an output coupled to said self reset circuit; a set circuit coupled to the dummy bit line output and having first and second outputs, the first output being coupled to the set input line; address generation means for sending a test cycle to said random access memory array; and feedback means comprising a restore logic circuit coupled to the second output of said set circuit and between said self reset circuit and said external clock output; and a compare latching circuit coupled between the restore logic circuit and an output of a data latch and a module output comprising the steps of:

sending a clock cycle having a first half and a second half, from said external clock to said module;

sending data to the module to initiate a test of said module; and feeding a signal from said set circuit through said restore logic circuit to said self reset circuit, to reset said self reset circuit multiple times, during the first half of the clock cycle, to repetitively send the data, through the module multiple times during the first half of the clock cycle to increase the number of times the circuits are stressed during the clock cycle.

* * * * *